United States Patent
Park

(10) Patent No.: US 7,872,928 B2
(45) Date of Patent: Jan. 18, 2011

(54) WRITE CONTROL SIGNAL GENERATION CIRCUIT, SEMICONDUCTOR IC HAVING THE SAME AND METHOD OF DRIVING SEMICONDUCTOR IC

(75) Inventor: Jung Hoon Park, Ichon (KR)

(73) Assignee: Hynix Semiconductor Inc. (KR)

( * ) Notice: Subject to any disclaimer, the term of this patent is extended or adjusted under 35 U.S.C. 154(b) by 282 days.

(21) Appl. No.: 11/962,023

(22) Filed: Dec. 20, 2007

(65) Prior Publication Data

US 2008/0253205 A1 Oct. 16, 2008

(30) Foreign Application Priority Data

Apr. 11, 2007 (KR) ........... 10-2007-0035495

(51) Int. Cl.
*G11C 7/00* (2006.01)
*G11C 7/06* (2006.01)
*G11C 8/00* (2006.01)

(52) U.S. Cl. ........... 365/194; 365/189.07; 365/193; 365/201; 365/233.1; 365/233.11

(58) Field of Classification Search ........... 365/189.07, 365/191, 193, 194, 201, 233.1, 233.11, 233.12, 365/233.13
See application file for complete search history.

(56) References Cited

U.S. PATENT DOCUMENTS

| 5,027,323 | A | * | 6/1991 | Miyamoto et al. | ..... 365/189.11 |
| 6,104,651 | A | * | 8/2000 | Cowles et al. | ............ 365/201 |
| 6,166,990 | A | * | 12/2000 | Ooishi et al. | ......... 365/233.11 |
| 6,816,416 | B2 | | 11/2004 | Won | |
| 7,043,672 | B2 | | 5/2006 | Merritt | |
| 2002/0163850 | A1 | * | 11/2002 | Song | ............... 365/233 |
| 2004/0243961 | A1 | | 12/2004 | Iadonato et al. | |
| 2007/0058459 | A1 | * | 3/2007 | Kitamura | ............ 365/193 |

FOREIGN PATENT DOCUMENTS

| JP | 2005-038526 | 2/2005 |
| KR | 1020040095885 A | 11/2004 |

* cited by examiner

*Primary Examiner*—Ly D Pham
(74) *Attorney, Agent, or Firm*—Baker & McKenzie LLP

(57) ABSTRACT

A write control signal generation circuit includes a delay/comparison/transmission block that outputs one of a delayed write command signal and a write command signal according to a test mode signal, and a control signal generation unit that generates a write control signal by delaying the output of the delay/comparison/transmission block corresponding to a variable amount of delay.

25 Claims, 10 Drawing Sheets

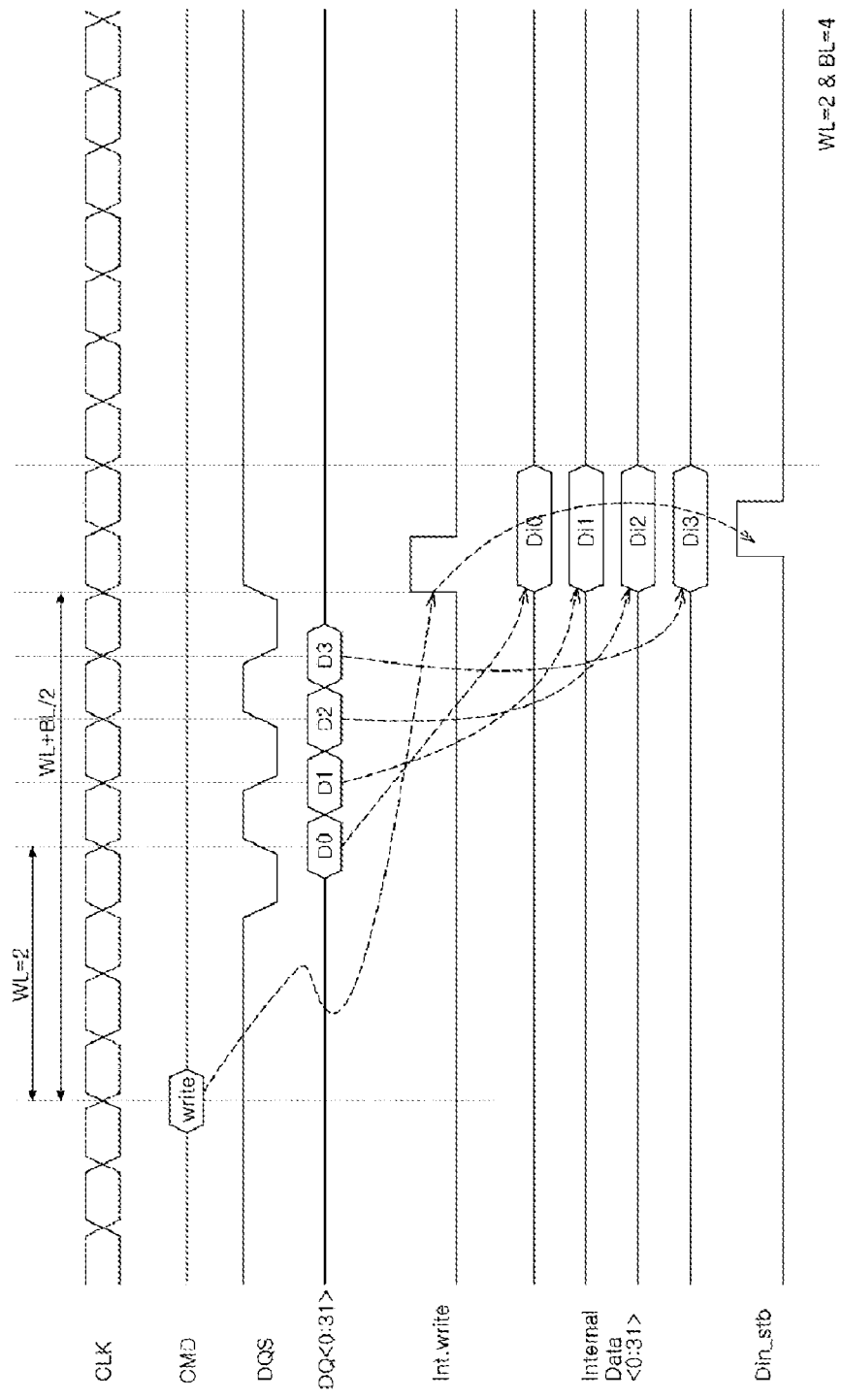

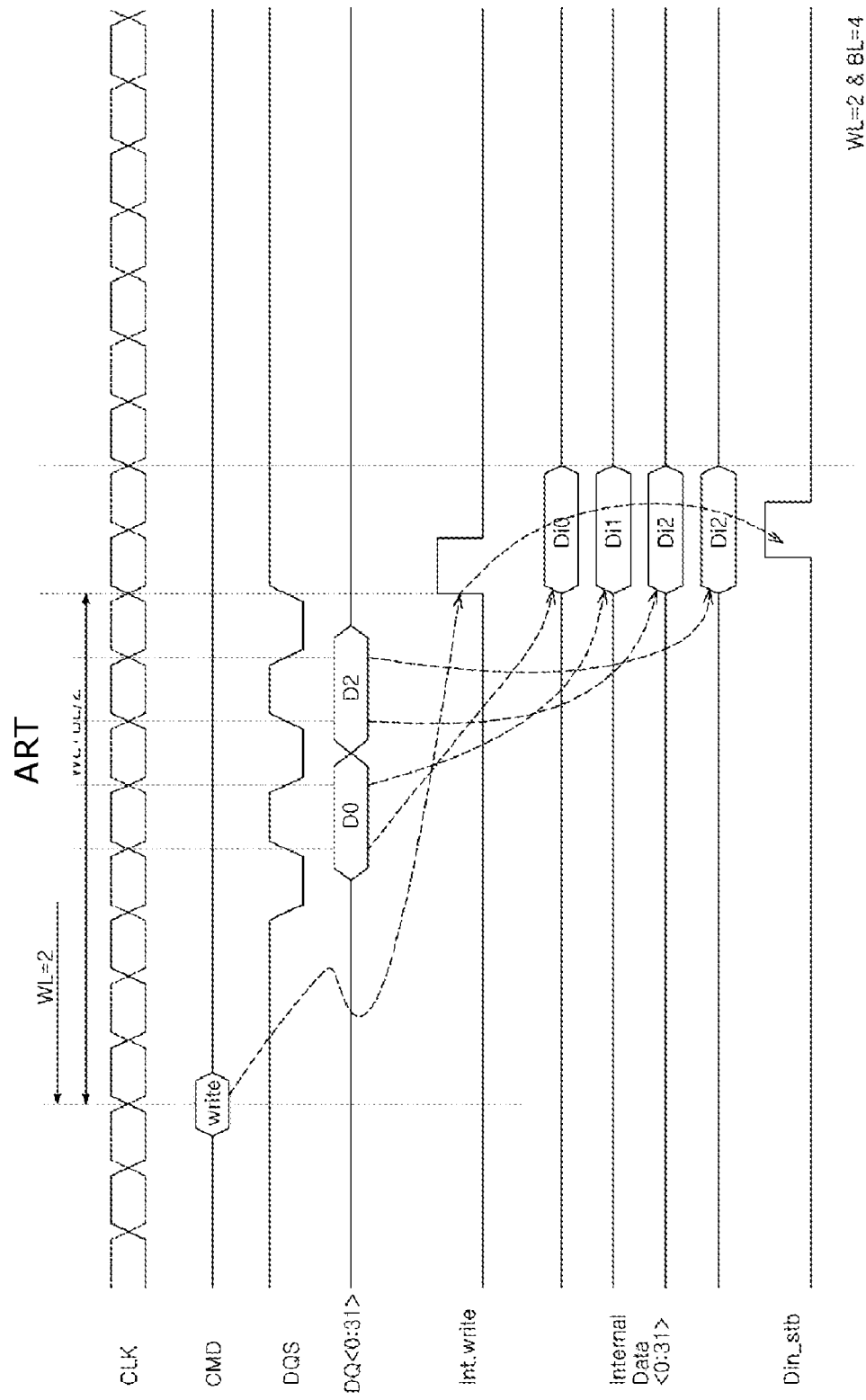
[FIG.2] PRIOR ART

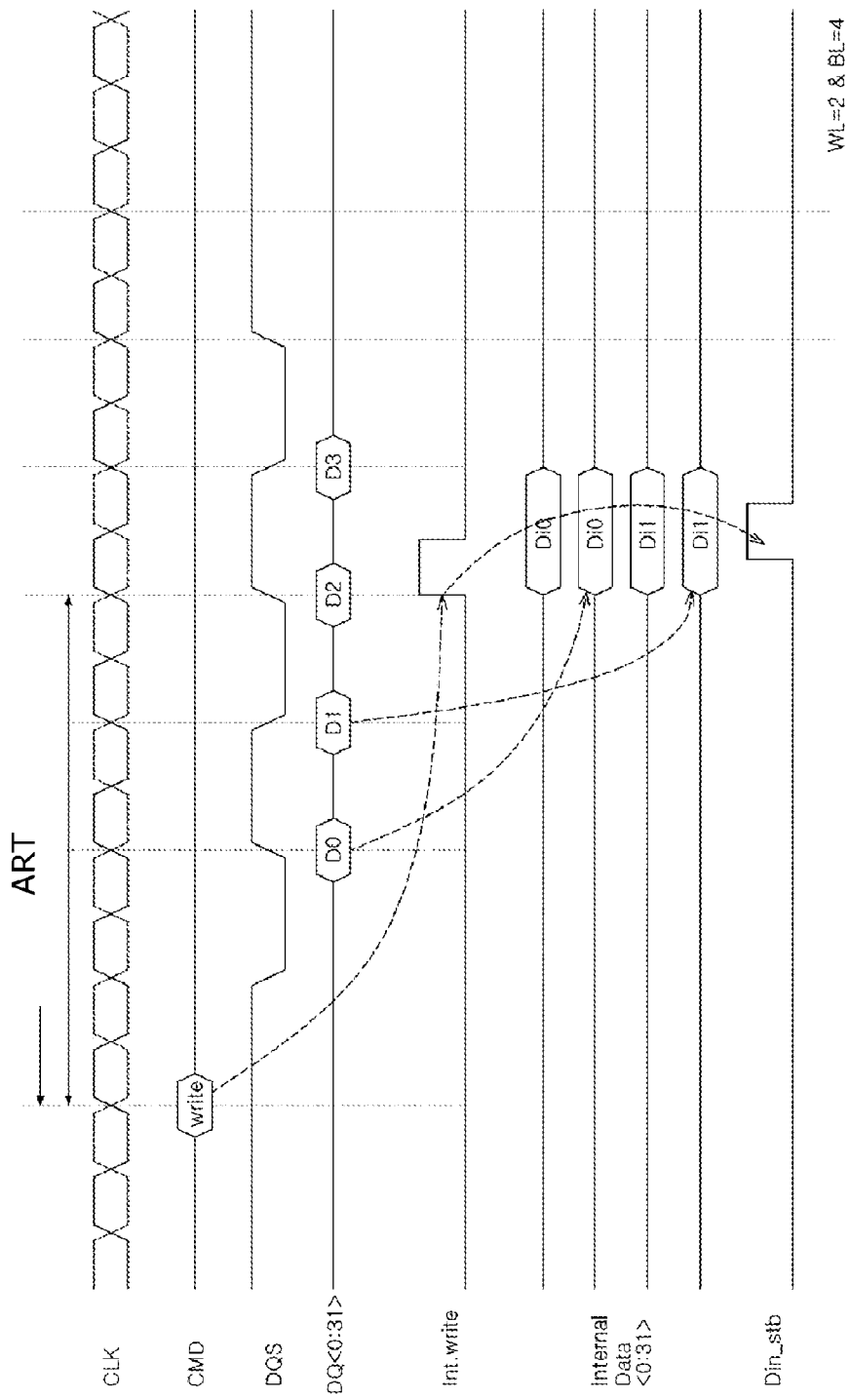

[FIG.4]
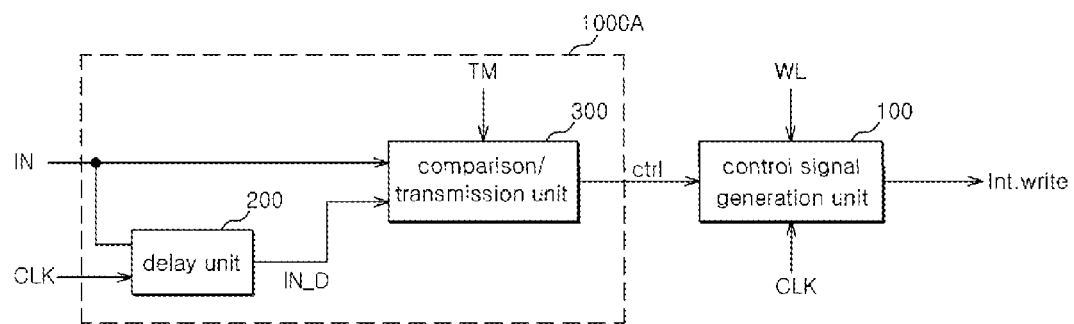
[FIG.5]
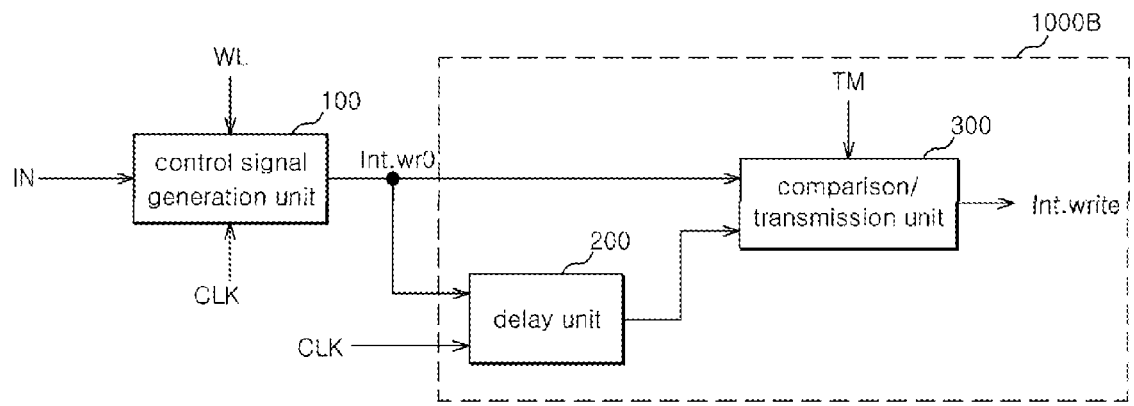

[FIG.6]
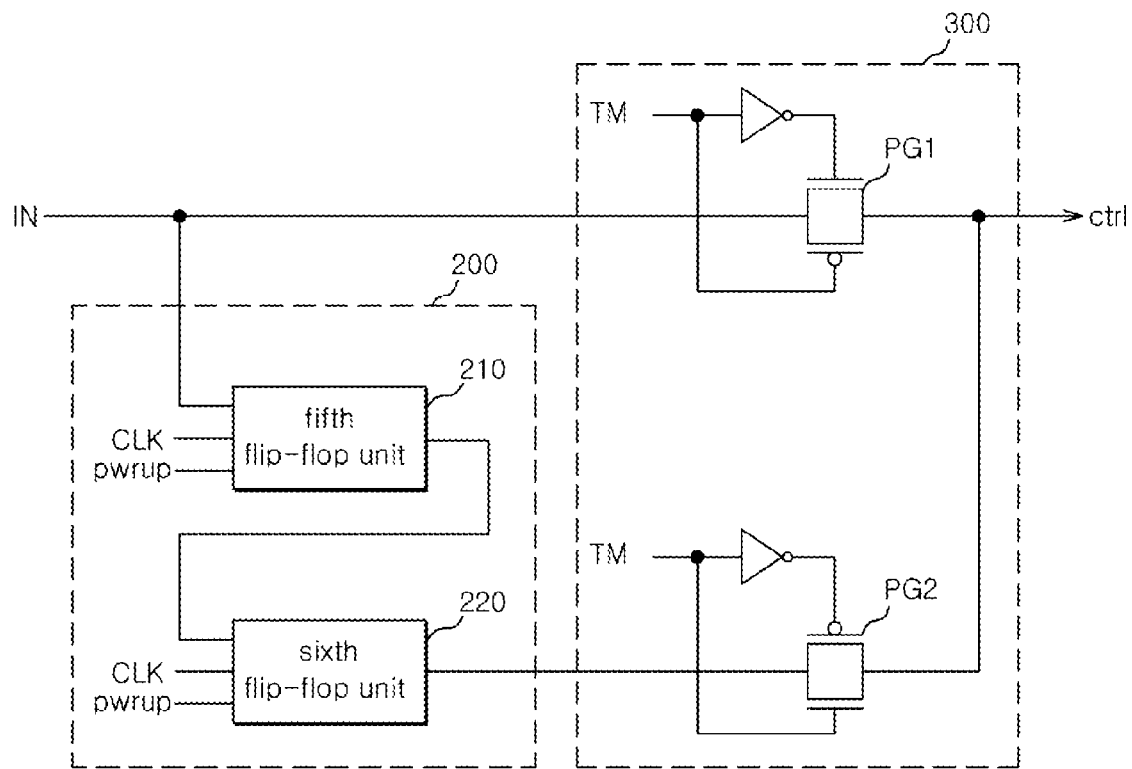

[FIG.7]
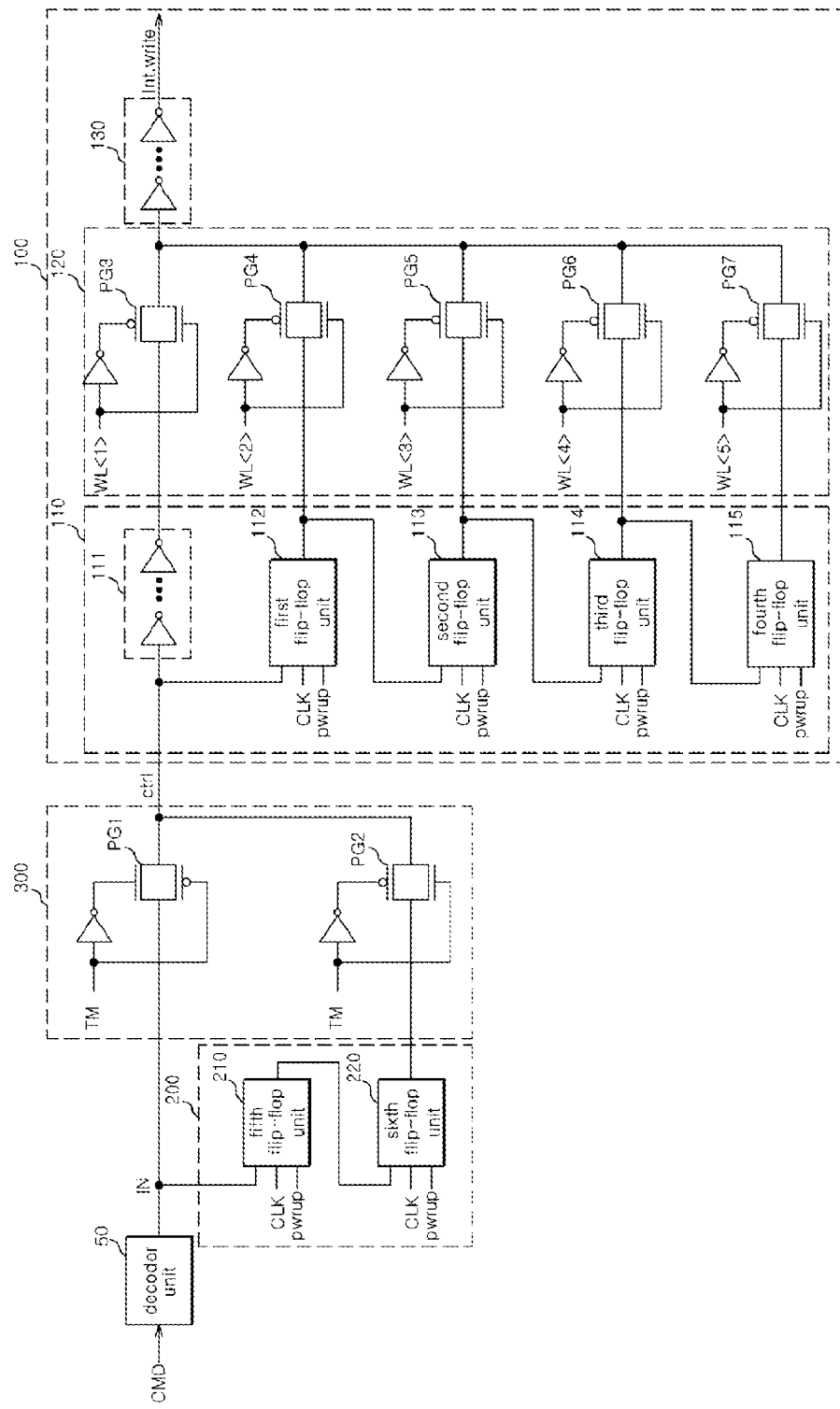

[FIG.8]
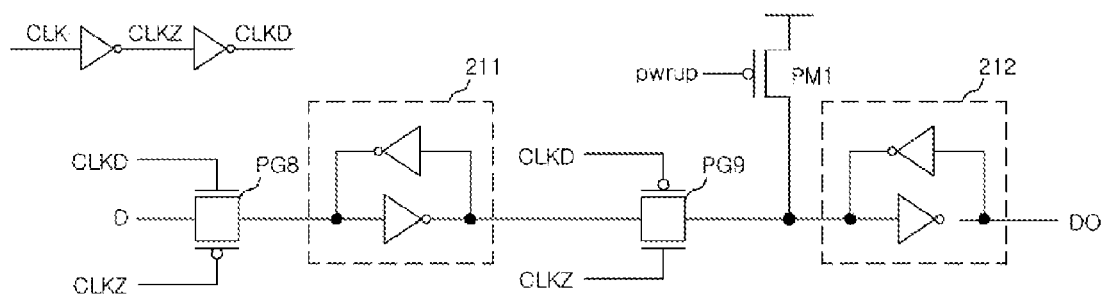
[FIG.9]
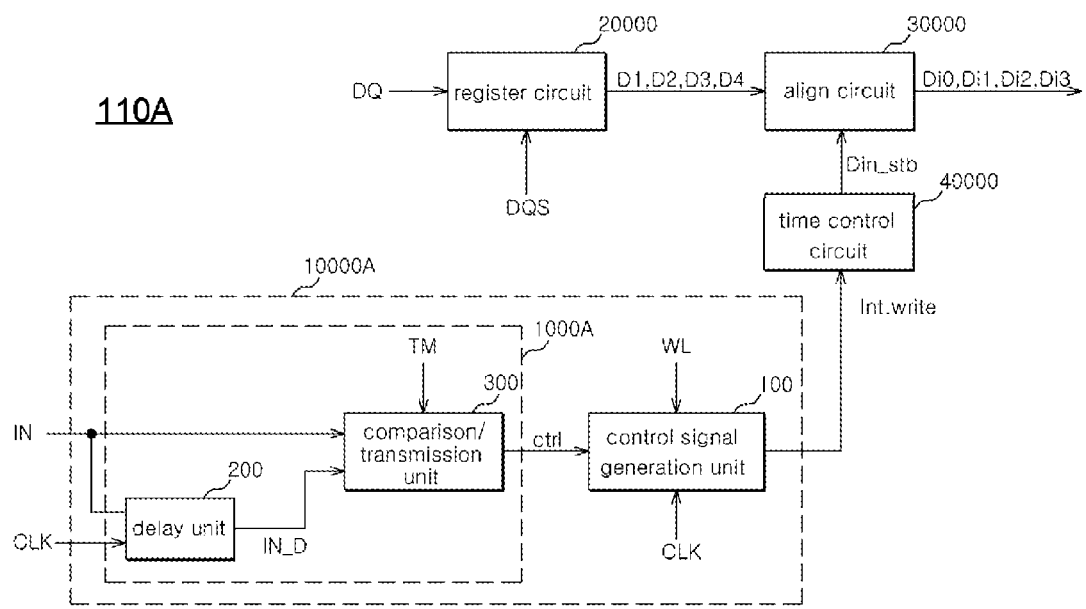

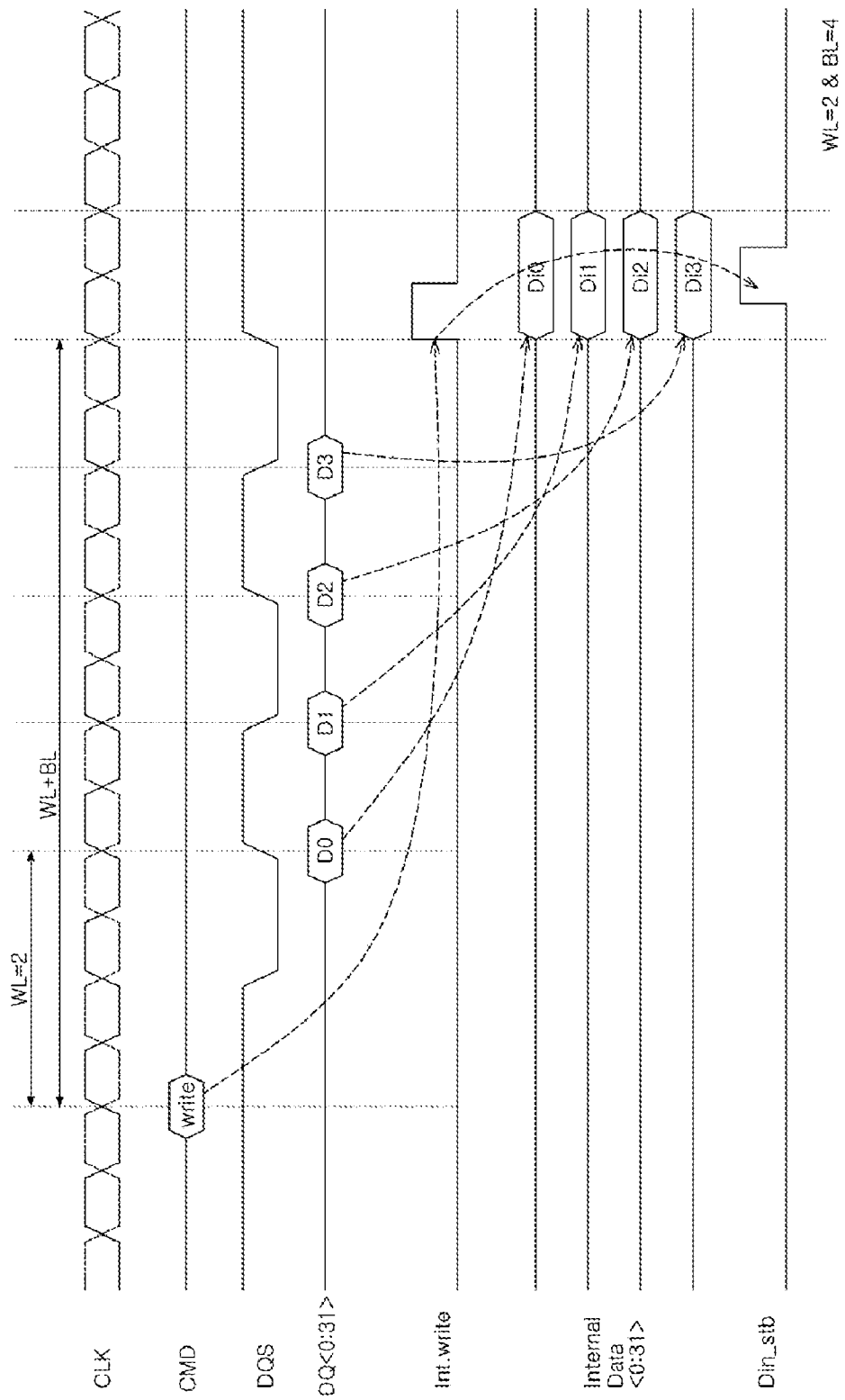
[FIG.10]

[FIG.11]
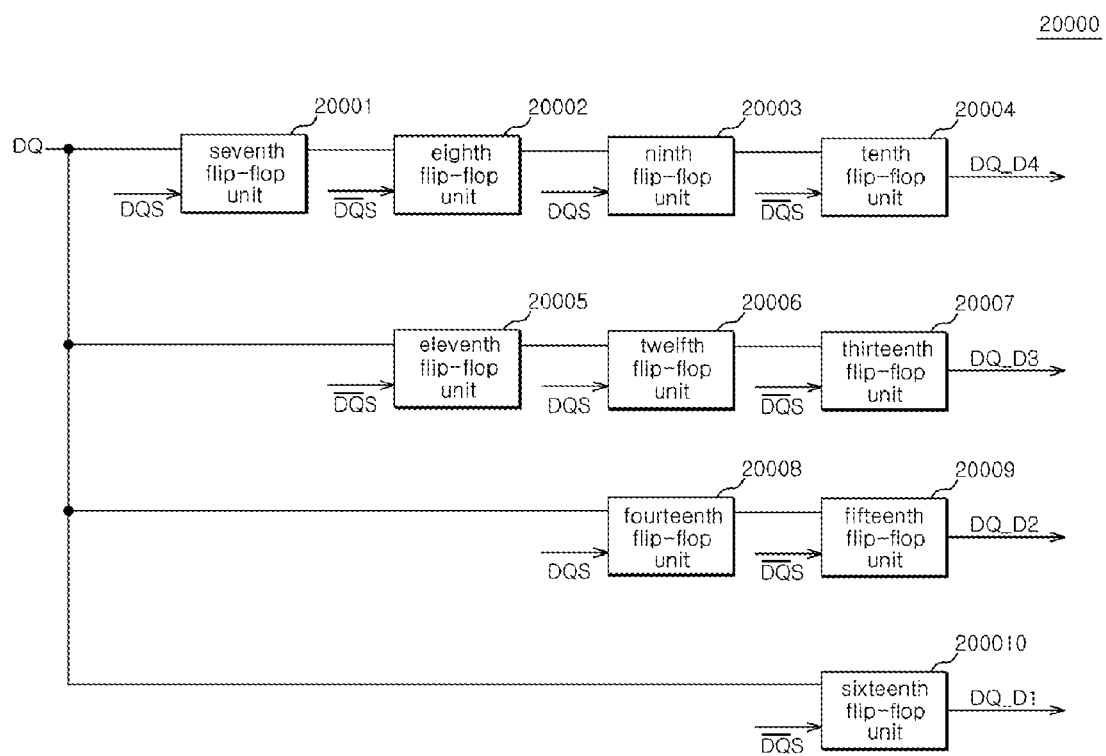

[FIG.12]
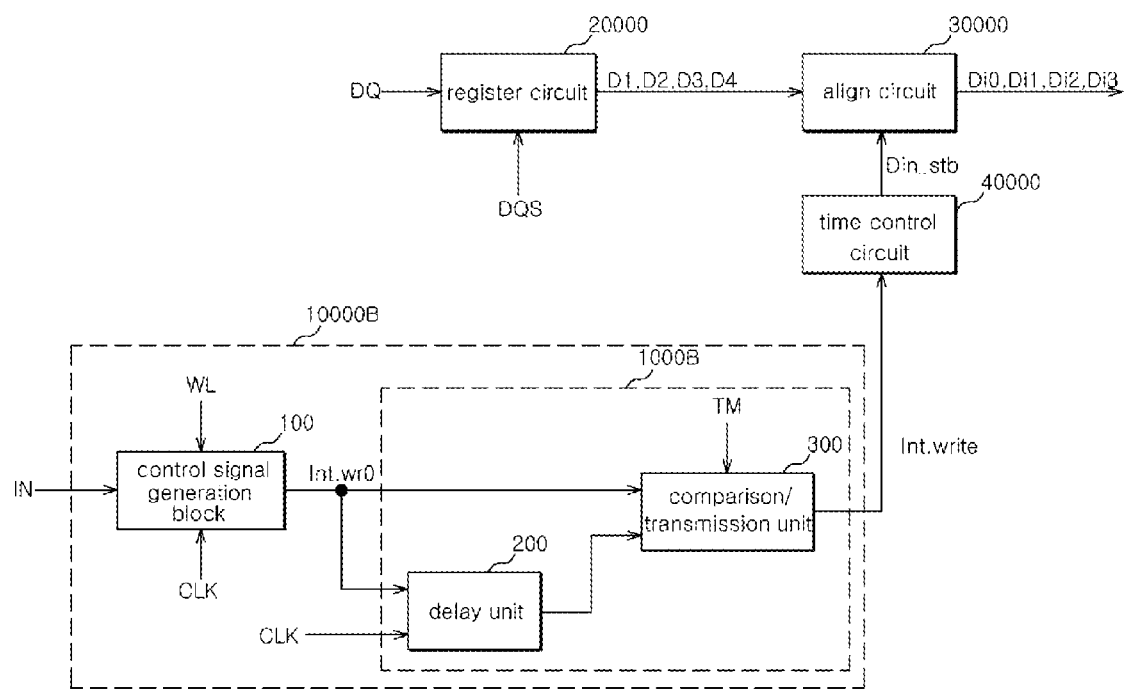

WRITE CONTROL SIGNAL GENERATION CIRCUIT, SEMICONDUCTOR IC HAVING THE SAME AND METHOD OF DRIVING SEMICONDUCTOR IC

CROSS-REFERENCES TO RELATED APPLICATION

The present application claims priority under 35 U.S.C. 119(a) to Korean application number 10-2007-0035495, filed on Apr. 11, 2007, which is incorporated by reference in its entirety as if set forth in full.

BACKGROUND

1. Technical Field

The embodiments described herein relate to a semiconductor integrated circuit (IC), and more particularly, to apparatus and methods for generating a write control signal in a semiconductor IC.

2. Related Art

Conventional Dynamic Random Access Memory (DRAM) devices operate at high frequencies. In order to test such devices, the test equipment used must employ a high-frequency clock. However, since the high-frequency clock used for current test equipment limits the number of usable test channels, the number of parameters or products that can be tested simultaneously is limited. For this reason, the test time and cost may increase.

FIG. 1 is an operational timing view for a semiconductor IC operated by receiving a write control signal (Int.write). The clock signal (CLK) and reference clock signal (DQS) shown in FIG. 1 are high frequency signals. In the timing view shown in FIG. 1, a write latency WL is equal to 2, and a burst length BL is equal to 4. Four external data bits D0, D1, D2 and D3 are input into the DRAM. Each of the external data bits D0, D1, D2 and D3 can be input into a DRAM core while being synchronized with a rising edge and falling edge of the reference clock signal (DQS). The write control signal (Int.write) is generated after the write latency WL period and half the burst length BL/2. The four external data bits D0, D1, D2 and D3 are serially input into the DRAM, but as the write control signal (Int.write) is enabled, the four external data bits D0, D1, D2 and D3 are transmitted to the DRAM core region in parallel using the high-speed clock signal (CLK). This is represented in the figure as internal data bits Di0, Di1, Di2, and Di3.

As mentioned above, in order to test the DRAM operation, the test equipment must employ high-frequency clock channels to test the high-frequency DRAM. However, as described above, the number of usable channels for high-frequency clock operation is limited in conventional test equipment. To solve this problem, there has been suggested a scheme, in which the high-frequency clock is used for the clock signal (CLK) and the reference clock signal (DQS), and a lower frequency clock signal, e.g., with a period at least twice that of the high frequency clock signal (CLK) is used for remaining data test pins of the test equipment.

FIG. 2 is a diagram illustrating the operational timing of such a scheme. As can be seen, the transmission speed of the external data does not correspond to the clock speed, so only two of four data are transmitted when the write control signal (Int.write) is enabled, i.e., only two data bits are transmitted to the DRAM core region in parallel after the write control signal (Int.write) is enabled In addition, as shown in FIG. 3, there has been suggested a scheme in which the lower frequency clock is used for the reference clock signal (DQS) and a high-frequency clock is used for the data signals. However, in this case, the external data bits D0, D1, D2 and D3 are input into the DRAM in synchronization with the rising edge and falling edge of the reference clock signal (DQS). Accordingly, only two of four data bits are transmitted when the write control signal (Int.write) is enabled, so the desired test result cannot be obtained.

Therefore, conventional test equipment is inefficient to test various parameters of high-frequency memory apparatus, such as high frequency DRAMs. Additionally, exchanging current test equipment can result in significant cost.

SUMMARY OF THE INVENTION

A write control signal generation circuit for testing various parameters of a high-frequency memory apparatus using conventional test equipment is described herein.

A semiconductor IC capable of testing various parameters of a high-frequency memory apparatus within a short period of time is also described.

According to one aspect, there is provided a write control signal generation circuit comprising a delay/comparison/transmission block that outputs one of a delayed write command signal and a write command signal according to a test mode signal and a control signal generation unit that generates a write control signal by delaying an output signal of the delay/comparison/transmission block according to a mode control signal.

According to another aspect, there is provided a semiconductor integrated circuit comprising a write control signal generation circuit that generates a write control signal by delaying a write command signal corresponding to a predetermined amount of delay according to a test mode signal and a mode control signal, a register circuit for storing external data in parallel and in synchronization with a reference clock, a time control circuit that outputs a data strobe in signal by delaying the write control signal for a predetermined period of time, and an alignment circuit that transmits an output of the register circuit to a core region in synchronization with the data strobe in signal.

According to still another aspect, there is provided a method of driving a semiconductor integrated circuit, the method comprising the steps of sequentially receiving data bits that are synchronized with a rising edge and a falling edge of a reference clock signal having a period greater than a clock period by N times (N is an integer number) and are delayed from a write command signal according to a write latency, outputting a write control signal by delaying the write control signal from the write command signal by a predetermined multiple of the clock period according to the write latency, burst length and the value of N, and transmitting the data into the semiconductor integrated circuit in parallel as the write control signal is enabled.

These and other features, aspects, and embodiments are described below in the section entitled "Detailed Description."

BRIEF DESCRIPTION OF THE DRAWINGS

Features, aspects, and embodiments are described in conjunction with the attached drawings, in which:

FIGS. 1 to 3 are operational timing diagrams for a conventional semiconductor memory apparatus when a write control signal is applied.

FIG. 4 is a block diagram of a write control signal generation circuit according to one embodiment.

FIG. 5 is a block diagram of a write control signal generation circuit according to another embodiment.

FIG. 6 is a detailed circuit view of a delay unit and a comparison/transmission unit included in the circuit shown in FIG. 4.

FIG. 7 is a detailed circuit view of a write control signal generation circuit included in the circuit shown in FIG. 4.

FIG. 8 is a detailed circuit view of a flip-flop unit included in the circuits shown in FIGS. 6 and 7.

FIG. 9 is a block diagram of a semiconductor IC including the write control signal generation circuit shown in FIG. 4.

FIG. 10 is an operational timing diagram for the semiconductor IC shown in FIG. 9.

FIG. 11 is a detailed circuit view of a register unit included in the IC shown in FIG. 9.

FIG. 12 is a block diagram of a semiconductor IC including the write control signal generation circuit shown in FIG. 5.

DETAILED DESCRIPTION

Referring to FIG. 4, a write control signal generation circuit 110 can include a delay/comparison/transmission block 1000A and a control signal generation unit 100. The delay/comparison/transmission block 1000A can be configured to provide a write command signal (IN) or a delayed version of the write command signal (IN) as an output signal (ctrl) according to a clock signal (CLK). The delay/comparison/transmission block 1000A consists of a delay unit 200 and a comparison/transmission unit 300.

The delay unit 200 receives the clock signal (CLK) and the write command signal (IN) and delays the write command signal (IN) according to the clock signal (CLK). In certain embodiments, the delay unit 200 can be configured to delay the write command signal (IN) by a multiple of the clock signal (CLK). The delay unit 200 can be used to match the data transmission speed with the timing of the write control signal (Int.write). That is, since there is limitation in number of high-frequency clock channels in the test equipment, testing of data signals can use a low frequency clock signal having a period greater than a period of the high-frequency clock signal (CLK). In this regard, the delay unit 200 is provided to match the relatively lowered data transmission speed with the timing of the write control signal (Int.write).

For instance, the delay unit 200 can be configured to delay the write command signal (IN) by N-times the clock signal (CLK) period. Here, "N" is the number of clock periods between the enable time of the write command signal and the time just after data bits have been sequentially input into the DRAM.

Further, the period of the reference clock (DQS) can be greater than the period of the clock signal (CLK) by M times (M is an integer number, for instance, 2).

When the data are input using a low frequency clock signal, then the time required for data input, which are output corresponding to the burst length BL, can be BL/2×M. In the case of the DDR, if the data are input using the clock signal (CLK), then the time required for data input corresponds to BL/2 and the delay time that occurs when using the low frequency clock signal corresponds to BL/2×(M−1). Therefore, N has a value corresponding to the multiple of BL/2×(M−1). That is, the delay unit 200 compensates for the difference in data transmission time when the low frequency clock signal is used for testing the data signals.

The comparison/transmission unit 300 selectively outputs the output signal (IN_D) of the delay unit 200 or the write command signal (IN) according to the test mode signal (TM). Depending on the embodiment, the write control signal generation circuit 100 can comprise a test mode and a normal operation mode. That is, since the low frequency clock is used in the test mode, the delay unit 200 outputs the signal (IN_D) by delaying the write command signal (IN) by N-times the clock period. In addition, however, the high-frequency clock (CLK) is used in the normal operation mode, so the delay unit 200 can output the write command signal (IN) without delaying the write command signal (IN) in normal operation mode.

The control signal generation unit 100 receives the output signal (ctrl) of the delay/comparison/transmission block 1000A, and varies the delay time of the write command signal (IN) according to the mode control signal (WL) to generate the write control signal (Int.write). The write control signal generation circuit 110 shown in FIG. 4 can be configured to use a write latency signal as the mode control signal (WL). In addition to the write latency signal, the burst length signal can be used as the mode control signal (WL) in other embodiments. When the control signal generation unit 100 generates the write control signal (Int.write), the delay time may be increased proportionally to the burst length BL and the write latency WL. The control signal generation unit 100 receives the write command signal (IN), which is related to the write operation and is one of decoding signals of the external command signal (CMD), to generate the write control signal (Int.write).

In another embodiment, as shown in FIG. 5, in other embodiments a write control signal generation circuit 120 can include a control signal generation unit 100 and a delay/comparison/transmission block 1000B. The control signal generation unit 100 can receive the write command signal (IN) and vary the delay time according to the mode control signal (WL). The delay/comparison/transmission block 1000B can selectively output the output (Int.wr0) or a signal that is obtained by delaying the output (Int.wr0) according to the test mode signal (TM), thereby generating the write control signal (Int.write).

As can be seen in the embodiment of FIG. 5, the delay/comparison/transmission block 1000B consists of a delay unit 200 and a comparison/transmission unit 300. The delay unit 200 can be configured to receive the clock signal (CLK) and delays the output (Int.wr0). The comparison/transmission unit 300 can be configured to output the output of the delay unit 200 or the output (Int.wr0) of the control signal generation unit 100 according to the test mode signal (TM), thereby generating the write control signal (Int.write).

The structure of the write control signal generation circuit 120 shown in FIG. 5 can be similar to that of the write control signal generation circuit 110 shown in FIG. 4. The signals input into the elements and the alignment of the elements shown in FIG. 5 can be different from those shown in FIG. 4; however, the structure and the operational principle of the write control signal generation circuit 120 shown in FIG. 5 can be very similar to those of the write control signal generation circuit shown in FIG. 4.

Referring to FIG. 6, the delay unit 200 can include fifth and sixth flip-flop units 210 and 220, which are operated in synchronization with the clock signal (CLK). The fifth and sixth flip-flop units 210 and 220 can store the received signals every one clock period and then output the stored signals when the next clock period is input. Thus, the delay unit 200 can generate a delayed version of the write command signal (IN), e.g., delayed by two clock periods, by means of the fifth and sixth flip-flop units 210 and 220. The delay unit 200 is provided with two flip-flop units 210 and 220 when the burst length BL is 4 and the reference clock signal (DQS) has a period greater than twice the period of the clock signal (CLK). However, the number of the flip-flop units can be changed according to the burst length BL and the period of the reference clock signal (DQS).

Thus, in certain embodiments, the burst length BL can be 4, the write latency WL can be 2, and the reference clock signal (DQS) can have a period greater than twice the period of the clock signal (CLK). But in other embodiments, a different burst length BL, write latency, and/or reference clock signal (DQS) period can be implemented as required.

Referring to FIG. 6, the comparison/transmission unit 300 can include a first pass gate PG1 and a second pass gate PG2. The first pass gate PG1 can transmit or block the write command signal (IN) according to the test mode signal (TM). The second pass gate PG2 can transmit or block the output (IN_D) of the delay unit 200 according to the test mode signal (TM). For instance, in the test mode, the first pass gate PG1 is blocked and the second pass gate PG2 is opened, so that the comparison/transmission unit 300 outputs the, e.g., two-clock delayed write command signal (IN_D), which is the output of the delay unit 200. Meanwhile, in the normal mode, the first pass gate PG1 is opened and the second pass gate PG2 is blocked, so that the comparison/transmission unit 300 outputs the write command signal (IN), which is not delayed.

Hereinafter, the structure of the write control signal generation circuit 110 shown in FIG. 4 will be described in detail with reference to FIG. 7; however, it will be understood that the delay unit 200 and the comparison/transmission unit 300 can have the circuit structure as shown in FIG. 6 for the embodiments illustrated in FIGS. 4 and 5 as well as for other embodiments.

In the embodiment of FIG. 4, the control signal generation unit 100 can include a plurality of flip-flop units 112, 113, 114 and 115 and a plurality of pass gates PG3 to PG7. The flip-flop units 112, 113, 114 and 115 delay the output of the comparison/transmission unit 300 by one clock period in synchronization with the clock signal (CLK). The pass gates PG3 to PG7 transmit or block the output of the flip-flop units 112, 113, 114 and 115 according to the mode control signal (WL). The flip-flop units 112, 113, 114 and 115 include D-flip-flops. In the present example, the control signal generation unit 100 includes four flip-flop units and five pass gates. However, the embodiments described herein are not necessary so limited.

A write control signal generation circuit 110 having the above structure operates as follows: First, the decoder unit 50 receives the external command signal (CMD) and decodes the external command signal (CMD) to generate the write command signal (IN). In the test mode, the test mode signal (TM) is enabled, so that the first pass gate PG1 that transmits the write command signal (IN) is blocked. The fifth and sixth flip-flop units 210 and 220 are synchronized with the clock signal (CLK), in which the fifth flip-flop unit 210 receives the write command signal (IN) when the clock signal (CLK) is high, and outputs the write command signal (IN) when the clock signal is low. After that, when the clock signal (CLK) is high, the sixth flip-flop unit 220 receives and stores the output of the fifth flip-flop unit 210. Then, when the clock signal (CLK) is low, the sixth flip-flop unit 220 outputs the stored signal. Thus, when two clock periods have lapsed after the write command signal (IN) is enabled, the output of the sixth flip-flop unit 220, that is, the output of the delay unit 200 has the waveform identical to that of the write command signal (IN), but delayed two clock periods.

As the test mode signal (TM) is enabled, the first pass gate PG1 of the comparison/transmission unit 300 is blocked, so that the write command signal (IN) is blocked. In addition, the second pass gate PG2 is opened, so that the output of the delay unit 200 is transmitted. Therefore, the comparison/transmission unit 300 outputs the two-clock delayed write command signal (IN_D).

In the normal operation mode, the test mode signal (TM) is disabled and the first pass gate PG1 of the comparison/transmission unit 300 is opened, so that the write command signal (IN) is transmitted. In addition, the second pass gate PG2 of the comparison/transmission unit 300 is blocked, so that the output of the delay unit 200 is blocked. Therefore, the comparison/transmission unit 300 transmits the write command signal (IN).

The control signal generation unit 100 can include a delay unit 110, a transmission unit 120, and a plurality of inverters 130. The delay unit 110 receives the write command signal (IN), which is the decoding signal of the external command signal (CMD), and delays the write command signal (IN), e.g., by one clock period. The transmission unit 120 selectively outputs one of output signals of the delay unit 110 according to the write latency signal (WL). The inverters 130 output the output signal of the transmission unit 120 by buffering the output signal of the transmission unit 120.

Whenever the clock signal (CLK) becomes high, first to fourth flip-flop units 112 to 114 of the delay unit 110 receive the signal through input terminals thereof and store the signal. In addition, whenever the clock signal (CLK) becomes low, the first to fourth flip-flop units 112 to 114 of the delay unit 110 output the stored signal through output terminals thereof. Thus, the output of the fourth flip-flop unit 114 is delayed by four clock periods from the write command signal (IN).

When the write latency WL is 2, the second write latency signal (WL<2>) is high, and the first, third, fourth and fifth latency signals (WL<1>), (WL<3>), (WL<4>) and (WL<5>) are low. Thus, among the pass gates PG3 to PG7 of the transmission unit 120, only the second pass gate PG4 controlled by the second write latency signal (WL<2>) transmits the received signal. That is, the output of the first flip-flop unit 111 becomes the output of the transmission unit 120. Therefore, the control signal generation unit 100 receives the output of the comparison/transmission unit 300, and then generates the signal, which is delayed by two clock periods, as the write control signal (Int.write).

As shown in FIG. 8, the flip-flop units 210, 220, 112, 113 and 114 (or 115) can comprise an eighth pass gate PG8, a first latch unit 211, a ninth pass gate PG9, a PMOS transistor PM1, and a second latch unit 212, respectively. The eighth pass gate PG8 transmits input data (D) when the clock signal (CLK) is high. The ninth pass gate PG9 transmits the output of the first latch unit 211 when the clock signal (CLK) is low. The second latch unit 212 latches the output of the ninth pass gate PG9. When the power up signal (pwrup) is low, the PMOS transistor PM1 fixes the voltage of the input terminal of the ninth pass gate PG9, thereby preventing the floating of the flip-flop units.

The flip-flop units transmit the input data (D) when the clock signal (CLK) is high, so that the input data (D) are stored in the first latch unit 211. After that, when the clock signal is low, the eighth path gate PG8 is blocked to block the input data (D) and the ninth pass gate PG9 is opened to output the input data (D). Then, when the clock signal is high, new input data are transmitted to the eighth pass gate PG8, so that the latch unit 211 repeats the above operation according to the clock signal (CLK) to store the new input data.

That is, the flip-flop unit receives the input data (D) whenever the clock signal (CLK) becomes high, and outputs the stored input data whenever the clock signal (CLK) becomes low.

FIG. 9 is a diagram illustrating an example semiconductor IC that includes a write control signal generation circuit 110A in accordance with one embodiment. Referring to FIG. 9, the semiconductor IC includes a write control signal generation circuit 10000A, a register circuit 20000, an alignment circuit 30000, and a time control circuit 40000.

As with the above embodiments, the write control signal generation circuit 10000A can consist of a comparison/transmission block 1000A including a delay unit 200 and a comparison/transmission unit 300, and a control signal generation unit 100. The write control signal generation circuit 10000A can be configured to generate the write control signal (Int.write) by delaying the write command signal (IN) corresponding to a variable amount of delay, according to the test mode signal (TM) and the mode control signal (WL).

The register circuit 20000 receives the external data bits D0, D1 ... Dn, collectively represented by the data signal (DQ) and which are serially input into the register circuit 20000, and stores the external data bits D0, D1 ... Dn in parallel by synchronizing the external data with the reference clock signal (DQS). As shown in FIG. 11, the register circuit 20000 can include a plurality of flip-flop units 20001 to 200010, which output the write command signal in synchronization with the reference clock signal (DQS). In detail, the register circuit 20000 includes the flip-flop units 20001 to 200010, which are synchronized with the rising edge and the falling edge of the reference clock signal (DQS). The flip-flop units 20001 to 200010 store the signals, which are input into the input terminals of the flip-flop units 20001 to 200010 in synchronization with the rising edge or the falling edge of the reference clock signal (DQS), and then output the stored signals. Thus, after 2 clock periods have lapsed from the reference clock signal (DQS), D4, D3, D2 and D1 are output as the output signals of the register circuit 20000, respectively. The time control circuit 40000 delays the write control signal (Int.write) by a predetermined time in order to output the data strobe in signal (Din_stb). A conventional delay circuit can be used as the time control circuit 40000.

The alignment circuit 30000 transmits the output of the register circuit 20000 into the semiconductor IC, such as the DRAM core region, in synchronization with the data strobe in signal (Din_stb). The data strobe in signal (Din_stb) can be derived from the write control signal (Int.write). The alignment circuit 30000 can transmit the output of the register circuit 20000 into the semiconductor IC, such as the DRAM core region, by delaying the timing of the write control signal (Int.write). The alignment circuit 30000 can include a typical latch circuit or a flip-flop circuit that outputs the signal in synchronization with the data strobe in signal (Din_stb).

Hereinafter, the operation of the semiconductor IC having the above structure will be described with reference to FIG. 10.

In the embodiment of FIG. 10, the external clock signal employs a high-frequency clock, and the reference clock signal (DQS) and the data signal employ the low frequency clock (a period of which is at least twice the period of the high-frequency clock). The external data D<0:31> are input in synchronization with the rising edge and the falling edge of the reference clock signal (DQS). The write control signal (Int.write) is enabled while being delayed from the external command signal (write) by the write latency WL time and the burst length BL time. Accordingly, the write control signal (Int.write) is enabled after the four data bits D0, D1, D2 and D3, which are serially input into the register circuit 20000, have been transmitted. Thus, it can be understood that the four data bits D0, D1, D2 and D3 are normally transmitted into the semiconductor IC, such as the DRAM core region.

In addition, according to another embodiment as shown in FIG. 12, a semiconductor IC can include a write control signal generation circuit 10000B having a control signal generation unit 100 and a comparison/transmission block 1000B consisting of a delay unit 200 and a comparison/transmission unit 300.

As described above, the write control signal generation circuit 10000B generates the write control signal (Int.write) by delaying the write command signal (IN) corresponding to a variable amount of delay, according to the test mode signal (TM) and the mode control signal (WL). The semiconductor IC according to such an embodiment is different from the semiconductor IC shown in FIG. 9 in terms of the alignment of the control signal generation unit 100, the delay unit 200 and the comparison/transmission unit 300, and the signals input into the above elements. However, the operational principle of the semiconductor IC according to the embodiment of FIG. 12 can be very similar to that of the semiconductor IC shown in FIG. 9, so it will not be further described below in order to avoid redundancy.

In conventional test devices, when the test is performed using a high-frequency clock signal, if a lower frequency clock signal is used for the data signal or the reference clock signal (DQS), then the write control signal (Int.write) is enabled before the external data bits D0, D1, D2 and D3, which are input into the register circuit 20000, have been completely stored. Thus, the alignment circuit 30000 cannot normally transmit the data to the semiconductor IC, such as the DRAM core region.

However, for the embodiments described herein, when the test is performed using a high-frequency clock signal, the write control signal (Int.write) is enabled after the data, which are delayed because the low frequency clock signal is used for the data signal, have been completely stored in the register circuit 20000. Thus, the alignment circuit 30000 can normally transmit the data to the semiconductor IC, such as the DRAM core region. Accordingly, it is possible to test various parameters using a clock signal having a period longer than the period of the clock signal used in normal operation mode, so the test time and cost can be reduced.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A write control signal generation circuit comprising:
   a delay/comparison/transmission block that outputs an output signal including one of a delayed write command signal and a write command signal in response to a test mode signal; and
   a control signal generation unit that generates a write control signal by delaying the output signal of the delay/comparison/transmission block in response to a mode control signal.

2. The write control signal generation circuit as claimed in claim 1, wherein the mode control signal includes at least one of a write latency signal and a burst length signal.

3. The write control signal generation circuit as claimed in claim 1, wherein the output signal of the control signal generation unit is delayed by an integer times of a clock period.

4. The write control signal generation circuit as claimed in claim 1, wherein the delay/comparison/transmission block includes:
   a delay unit receiving a clock and delaying the write command signal; and
   a comparison/transmission unit outputting one of the delayed write command signal and the write command signal according to the test mode signal.

5. The write control signal generation circuit as claimed in claim 4, wherein a delay time of the delay unit corresponds to a multiple of a clock period.

6. The write control signal generation circuit as claimed in claim 4, wherein the delay unit includes a flip-flop unit that outputs the write command signal in synchronization with the clock.

7. The write control signal generation circuit as claimed in claim 4, wherein the comparison/transmission unit includes a transmission device that transmits the write command signal or an output of the delay unit according to an enable state of the test mode signal.

8. A write control signal generation circuit comprising:
a control signal generation unit that delays a write command signal according to a mode control signal; and
a delay/comparison/transmission block that outputs one of an output of the control signal generation unit and a signal, which is obtained by delaying the output of the control signal generation unit, according to a test mode signal,
wherein an amount of delay of the control signal generation unit is varied.

9. The write control signal generation circuit as claimed in claim 8, wherein the output of the control signal generation unit is delayed by an integer times of a clock period.

10. The write control signal generation circuit as claimed in claim 8, wherein the mode control signal includes at least one of a write latency signal and a burst length signal.

11. The write control signal generation circuit as claimed in claim 8, wherein the delay/comparison/transmission block includes:
a delay unit receiving a clock and delaying the output of the control signal generation unit; and
a comparison/transmission unit outputting one of outputs of the delay unit and the control signal generation unit according to the test mode signal.

12. The write control signal generation circuit as claimed in claim 11, wherein a delay time of the delay unit corresponds to a multiple of a clock period.

13. The write control signal generation circuit as claimed in claim 12, wherein the multiple of the clock period is proportional to a burst length.

14. The write control signal generation circuit as claimed in claim 11, wherein the delay unit includes a flip-flop unit that outputs the write command signal in synchronization with the clock.

15. The write control signal generation circuit as claimed in claim 11, wherein the comparison/transmission unit includes a transmission device that transmits the output of the control signal generation unit or the output of the delay unit according to an enable state of the test mode signal.

16. A semiconductor integrated circuit comprising:
a write control signal generation circuit that generates a write control signal by delaying a write command signal by a first amount of delay or a second amount of delay in response to a test mode signal and a mode control signal;
a register circuit for storing external data in parallel in synchronization with a reference clock;
a time control circuit that outputs a data strobe in signal by delaying the write control signal for a predetermined period of time; and
an alignment circuit that transmits an output of the register circuit to a core region in synchronization with the data strobe in signal.

17. The semiconductor integrated circuit as claimed in claim 16, wherein the reference clock has a period greater than a period of a clock by a predetermined multiple, and the external data is input into the register circuit in synchronization with the reference clock when the test mode signal is enabled.

18. The semiconductor integrated circuit as claimed in claim 16, wherein the mode control signal is one of a write latency signal and a burst length signal.

19. The semiconductor integrated circuit as claimed in claim 16, wherein a period of the reference clock is greater than a period of a clock by M times (M is a natural number), and the second amount of delay corresponds to burst length/$2\times(M-1)$.

20. The semiconductor integrated circuit as claimed in claim 16, wherein the write control signal generation circuit includes:
a control signal generation unit that delays the write control signal by the predetermined amount of delay according to the mode control signal;
a delay unit receiving a clock and delaying an output of the control signal generation unit; and
a comparison/transmission unit that generates the write control signal by outputting one of outputs of the delay unit and the control signal generation unit according to the test mode signal.

21. The semiconductor integrated circuit as claimed in claim 16, wherein the comparison/transmission unit includes a transmission device that transmits the output of the control signal generation unit or the output of the delay unit according to an enable state of the test mode signal.

22. The semiconductor integrated circuit as claimed in claim 16, wherein the write control signal generation circuit includes:
a delay unit receiving a clock and delaying the write command signal;
a comparison/transmission unit that outputs one of the output of the delay unit and the write command signal according to the test mode signal; and
a control signal generation unit that generates the write control signal by delaying an output of the comparison/transmission unit by a predetermined amount of delay according to the mode control signal.

23. The semiconductor integrated circuit as claimed in claim 22, wherein the comparison/transmission unit includes a transmission device that transmits the write command signal or the output of the delay unit according to an enable state of the test mode signal.

24. A method of driving a semiconductor integrated circuit, the method comprising the steps of:
sequentially receiving data, which are synchronized with a rising edge and a falling edge of a reference clock delayed from a write command signal according to a write latency;
outputting a write control signal by delaying the write control signal from the write command signal by a first amount of delay or a second amount of delay based on the write latency and burst length; and
transmitting the data into the semiconductor integrated circuit in parallel as the write control signal is enabled.

25. The method as claimed in claim 24, wherein the data transmission step includes the steps of:
outputting a strobe in signal by delaying the write control signal for a predetermined period of time; and
transmitting the data into the semiconductor integrated circuit in parallel in synchronization with the strobe in signal.

* * * * *